(12) United States Patent
Yamada et al.

(10) Patent No.: US 6,977,395 B2
(45) Date of Patent: Dec. 20, 2005

(54) SEMICONDUCTOR DEVICE

(75) Inventors: Motokazu Yamada, Anan (JP); Shinya Sonobe, Anan (JP); Masahiko Sano, Anan (JP)

(73) Assignee: Nichia Corporation, Tokushima (JP)

( * ) Notice: Subject to any disclaimer, the term of this patent is extended or adjusted under 35 U.S.C. 154(b) by 110 days.

(21) Appl. No.: 10/433,327

(22) PCT Filed: Jul. 12, 2002

(86) PCT No.: PCT/JP02/07087

§ 371 (c)(1),
(2), (4) Date: Jun. 2, 2003

(87) PCT Pub. No.: WO03/007390

PCT Pub. Date: Jan. 23, 2003

(65) Prior Publication Data

US 2004/0026702 A1 Feb. 12, 2004

(30) Foreign Application Priority Data

Jul. 12, 2001 (JP) ........................................ 2001-212887

(51) Int. Cl.[7] .............................................. H01L 33/00
(52) U.S. Cl. ............................ 257/99; 257/94; 257/103
(58) Field of Search ............................... 257/79, 94, 98, 257/99, 103, 13; 438/39, 46, 47

(56) References Cited

U.S. PATENT DOCUMENTS 5,650,337 A * 7/1997 Cahen et al. ......... 257/E21.699
5,668,048 A * 9/1997 Kondo et al. .......... 257/E21.11
6,610,606 B2 * 8/2003 Sakai et al. .......... 257/E29.144
6,727,518 B2 * 4/2004 Uemura et al. ................ 257/79

FOREIGN PATENT DOCUMENTS

| JP | 05-335622 | 12/1993 |
| JP | 11-186599 | 7/1999 |
| JP | 11-220171 | 8/1999 |

* cited by examiner

*Primary Examiner*—Kevin M. Picardat
(74) *Attorney, Agent, or Firm*—Wenderoth, Lind & Ponack, L.L.P.

(57) ABSTRACT

A semiconductor device has at least a GaN system semiconductor having n-conductivity type and a GaN system semiconductor having p-conductivity type layered on a substrate. Electrodes are formed on both surfaces of the GaN system semiconductor layer having n-conductivity type and the GaN system semiconductor layer having p-conductivity type. A first electrode including at least silver and a second electrode excluding silver are formed on the surface of the GaN system semiconductor layer having p-conductivity type, with the second electrode surrounding the periphery of the first electrode. In addition, the first electrode has an opening at which the GaN system semiconductor layer having p-conductivity type is exposed inside of the outline of the first electrode. According to such structure, it is possible to realize a device having high luminous efficiency in use and high reliability.

20 Claims, 9 Drawing Sheets

SEMICONDUCTOR DEVICE

TECHNICAL FIELD

The present invention relates to a semiconductor device acting as a light emitting device or a light receiving device, on which a pair of positive and negative electrodes is formed, and particularly relates to a light emitting device composed of $Al_xIn_yGa_{1-x-y}N$ ($0 \leq x$, $0 \leq y$, $x+y<1$).

BACKGROUND ART

It is not too much to say that there is no time that we never see a light emitting device in our daily lives, such as a traffic light, a destination direction board at a station and an airport, a large size display disposed on the outer wall of a building, and further a backlight source in a cellular phone or the like. Thus, a light emitting device made of laminated semiconductors and a light receiving device to which the light emitting device is applied are indispensable, so that the need for improving the properties required for these devices continues increasing.

Particularly, a blue light emitting device has been developed behind the other three primary colors, namely, red, and green, and the blue light emitting device matching with the improvement of the property and each purpose is the most desired.

As such a blue light emitting device, a nitride semiconductor device including gallium (hereinafter, referred to as GaN system semiconductor device) is most used. As a structure of this GaN system semiconductor device, basically, a buffer layer composed of GaN on a sapphire substrate, an n-side contact layer composed of Si-doped GaN, an active layer containing an InGaN layer with a single quantum well structure or a multiple quantum well structure, a p-side cladding layer composed of Mg-doped AlGaN, and a p-side contact layer composed of Mg-doped GaN are stacked in this sequence. Further, on a surface of the n-side contact layer, on which a portion of the p-side cladding layer is etched to be exposed, an n-electrode composed of titanium/aluminum is formed, and on a surface of the remaining p-side contact layer, a p-electrode composed of nickel/gold is formed. This shows very excellent properties with a light emitting wavelength of 450 nm at 5 mW and an outside quantum efficiency of 9.1% at 20 mA.

FIG. 12 is a perspective view for showing an example of a conventional GaN system semiconductor device, and FIG. 13 is a top plan view thereof. In a GaN system semiconductor device having the above-described structure, on a substrate 301, an n-conductivity type semiconductor layer 302 including an n-side contact layer and an n-side cladding layer or the like, an active layer 303, and a p-conductivity type semiconductor layer 304 including a p-side cladding layer and a p-side contact layer or the like are layered in this sequence, and a p-electrode 306 is structured of laminated nickel/gold on a surface of the p-side contact layer. This p-electrode 306 is formed on nearly the entire surface of the p-side contact layer. An n-electrode 307 is disposed so as to be electrically connected to the n-conductivity type semiconductor layer 302.

Unless a p-type impurity is doped, the GaN system semiconductor represents the n-type. In order to-realize the GaN system semiconductor device having a p-n junction, the GaN system semiconductor representing the p-type is essential.

For example, subsequently to growth of GaN that is doped with Mg, further, using a method such as annealing and irradiation of an electron ray or the like, it is possible to obtain a p-type GaN. However, as it is obvious that GaN cannot be made into the p-type easily unless the particular method is applied, the GaN system semiconductor tends to be hardly made into the p-type, namely, the GaN system semiconductor representing the p-type tends to have a higher electric resistivity as compared to the GaN system semiconductor representing the n-type. In the case where the GaN system semiconductor layer has a high electric resistivity, an electric current applied to the light emitting device is hardly distributed in the p-type semiconductor layer, so that the emitted light due to a carrier recombination is biased with the light emission unevenly on the surface. As a countermeasure therefor, the p-electrode is formed on the entire surface of the p-side contact layer so that the electric current can flow evenly on the entire surface of the p-type semiconductor layer, resulting in minimizing the unevenness of the light emission.

In addition, nickel/gold can have translucency at 200 angstroms and good ohmic contact with the p-type GaN semiconductor device representing the p-type, so that it is preferably used as a p-electrode material.

However, since gold has the nature of absorbing light having a wavelength shorter than about 550 nm, when gold is used as a p-electrode material, it may absorb the light emitted under the p-electrode. As a result, the light emitted inside the device is not effectively emitted outside.

DISCLOSURE OF THE INVENTION

An object of the present invention is to provide a semiconductor device having high luminous efficiency for usage and high reliability.

The present invention has the following constitutions:

(1) A semiconductor device wherein at least a first conductivity type semiconductor layer and a second conductivity type semiconductor layer, the second conductivity type being different from the first conductivity type, are sequentially layered on a substrate, and an electrode is formed on a surface of the second conductivity type semiconductor layer; and a first electrode including at least silver and a second electrode excluding silver are formed on the surface of the second conductivity type semiconductor layer.

(2) The semiconductor device described in (1), wherein the first electrode comprises a layer composed of silver, silver-nickel alloy, silver-palladium alloy, silver-rhodium alloy, or silver-platinum alloy.

(3) The semiconductor device described in (1) or (2), wherein the second electrode is formed on the surface of the second conductivity type semiconductor layer so as to surround a periphery of the first electrode.

(4) The semiconductor device described in any of (1) to (3), wherein an electric potential barrier at a contact portion between the first electrode and the second conductivity type semiconductor layer is smaller than an electric potential barrier at the contact portion between the second electrode and the second conductivity type semiconductor layer.

(5) The semiconductor device described in any of (1) to (3), wherein an ohmic property at the contact portion between the first electrode and the second conductivity type semiconductor layer is better than an ohmic property at the contact portion between the second electrode and the second conductivity type semiconductor layer.

(6) The semiconductor device described in any of (1) to (5), wherein the first electrode contains at least one among rhodium, palladium, nickel, and platinum.

(7) The semiconductor device described in any of (1) to (6), wherein the second electrode is set at an electric potential equal to or higher than that of the first electrode.

(8) The semiconductor device described in (7), wherein the second electrode partially contacts with the first electrode on the surface of the second conductivity type semiconductor layer.

(9) The semiconductor device described in (8), wherein a pad electrode for leading out is formed so as to contact with both of the first and second electrodes.

(10) The semiconductor device described in any of (1) to (9), wherein the surface of the second conductivity type semiconductor layer has an area in which no electrode is formed between an area in which the first electrode is formed and an area in which the second electrode is formed.

(11) The semiconductor device described in (10), wherein the area in which no electrode is formed is provided so that the shortest distance between the first electrode and the second electrode becomes not less than 0.5 μm.

(12) The semiconductor device described in any of (1) to (11), wherein the first electrode has an opening portion on the inside of the outline of the first electrode, and the second conductivity type semiconductor layer is exposed at the opening portion.

(13) The semiconductor device described in any of (1) to (12), wherein the semiconductor device is a light emitting device, and in a light emitting area on the surface of the second conductivity type semiconductor layer, a light emission intensity at the periphery of the first electrode is stronger than that at the remaining light emitting area except for the periphery of the first electrode.

(14) The semiconductor device described in (12) or (13), wherein, at the first electrode, $L/S \geq 0.024$ μm/μm$^2$ is established, where a gross area of a plurality of opening portions at which the second conductivity type semiconductor layer is exposed is Sa, an area of no-opening portion at which the second conductivity type semiconductor layer is not exposed is Sb, the sum of Sa and Sb is S, and the sum of the inner peripheries of all the opening portions is L.

(15) The semiconductor device described in (14), wherein each opening portion has substantially the same form or substantially the same area.

(16) The semiconductor device described in any of (1) to (15), wherein each of the semiconductor layer is formed of nitride semiconductor containing at least gallium.

(17) The semiconductor device described in any of (1) to (16), wherein the first conductivity type semiconductor layer is exposed by partial etching of the second conductivity type semiconductor layer, and on the surface where the first conductivity type semiconductor layer is exposed, a third electrode is formed.

(18) The semiconductor device described in any of (1) to (17), wherein the first conductivity type semiconductor layer is an n-type semiconductor layer, and the second conductivity type semiconductor layer is a p-type semiconductor layer.

According to the present invention, by using silver as an electrode material, as compared to the conventional case of using gold, the light of a wavelength shorter than about 550 nm cannot be absorbed, so that the luminous efficiency in use may be improved.

In addition, since silver has a low electric resistivity and indicates a good conductivity, even if the thickness of the film of the electrode is made thinner, the electric resistivity can be prevented from increasing. Therefore, a degree of freedom in the design of the film thickness of the electrode is enhanced. For example, forming the thick electrode may allow the light reflexivity of the electrode to increase, or forming the thin electrode may allow the light transmittancy of the electrode to increase.

However, silver is known as a material in which electro-migration easily occurs. In case the semiconductor device in which silver is used for either the p-electrode material or the n-electrode material has the electricity turned on, silver existing in one electrode may move toward another electrode along the side face of the device, resulting in a short circuit due to the precipitation of silver.

Therefore, not only a first electrode including silver but also a second electrode excluding silver are formed on the surface where one electrode is to be formed thereon, thereby preventing the short circuit because of the existence of the second electrode even if the electro-migration of silver may occur. Thus a semiconductor device with high reliability can be obtained.

Furthermore, since the first electrode has an opening portion on the inside of the outline of the first electrode and the second conductivity type semiconductor layer is exposed at the opening portion, a device with a lowered $V_f$ (forward drive voltage) can be obtained.

BEST MODE FOR CARRYING OUT THE INVENTION

Figure 1:
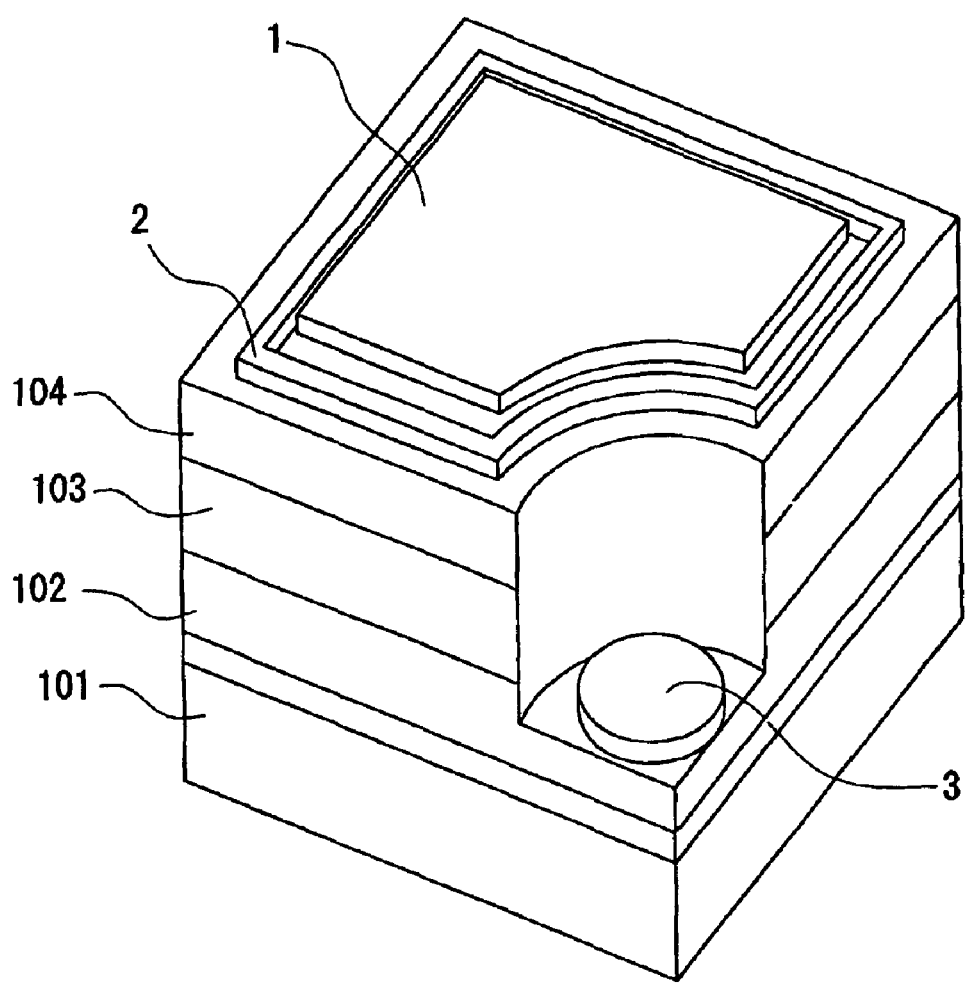
FIG. 1 is a perspective view of a semiconductor device according to a first embodiment of the present invention.

Next, the embodiments according to the present invention will be described in detail.

According to the present invention, the first electrode formed on the second conductivity type semiconductor layer may contain at least silver, in the form of a single layer of silver, or layers of silver and another metal sequentially stacked, or an alloyed layer of silver and the other metal stacked and annealed. As the alloyed layer, for example, an alloyed metal, in which silver (Ag) is added with 1 to 30% of nickel (Ni), palladium (Pd), rhodium (Rh), or platinum (Pt) or the like may be used. Ni and Pd are preferable since they can easily obtain ohmic contact with a GaN system semiconductor such as the p-type GaN or the like; more preferably, Ni may be used.

In addition, as a metal used for the first electrode, Co, Fe, Ti, Cu, Rh, Au, Ru, W, Mo, Ta and Pt or the like may be used in addition to Ag, Ni and Pd, and preferably excluding a material that may absorb much light.

With respect to the film thickness of the electrode, when the first electrode is formed thick, the light generated within the device is reflected on the first electrode and the light can be effectively returned to the laminated side of the semiconductor, so that the light emission efficiency from the side face of the device is improved. When the first electrode is formed thin, on the contrary, the first electrode is likely to have light transmittancy. Therefore, in one case of the light emitting device, the light generated within the device is effectively emitted to the outside, and in another case of the light receiving device, the light arriving from the outside effectively enters within the device.

Since silver has a lower electric resistivity of $1.59 \times 10^{-6}$ ($\Omega$cm), as compared to the other metal materials, even if the first electrode is formed with a thin thickness, the electric resistivity of the first electrode does not increase abruptly so that it is easy to treat in spite of a thin film.

The following table 1 shows $V_f$ (forward drive voltage), a light output and its relative value of a semiconductor light emitting device, when the material of the first electrode is altered. Incidentally, each measured value is an average value of each measurement of ten devices.

TABLE 1

| Electrode material | $V_f$ (volt) | Light output (mW) | Light output relative value |
| --- | --- | --- | --- |
| Cu | 4.70 | 8.84 | 1.078 |
| Pd | 4.77 | 8.69 | 1.059 |
| Ag | 4.37 | 14.27 | 1.740 |
| Ni/Au | 3.68 | 8.20 | 1.000 |

From this result, it can be found that in the case that the first electrode is made of silver, it is possible to lower $V_f$ than Cu and Pd, and the light output is remarkably increased more than Ni/Au.

On the second conductivity type semiconductor layer, a second electrode excluding silver is formed. As a material for the second electrode, a metal in which electro-migration hardly occurs may be used in the form of a single layer, or layers of a plurality of stacked metals, or an alloyed layer of a plurality of stacked and annealed metals. The second electrode may contain a material which greatly absorbs the light, such as gold or the like. However, a semiconductor device with less light absorption on the entire surface of the second conductivity type semiconductor layer can be realized by excluding such a material.

With respect to the film thickness of the electrode, similarly to the first electrode, when the second electrode is formed thick, the light can be more effectively returned to the laminated side of the semiconductor, so that the light emission efficiency from the side face of the device is improved. When the second electrode is formed thin, on the contrary, the first electrode is likely to have light transmittancy. In one case of the light emitting device, the light generated within the device is effectively emitted to the outside, and in another case of the light receiving device, the light arriving from the outside is effectively entered within the device.

Furthermore, according to the present invention, the second electrode is preferably formed so as to surround the circumference of the first electrode. Forming such a second electrode can block the movement of a silver atom due to the electro-migration or the like when the device is electrically energized. In the other words, when the silver atom residing in the first electrode intends to move from the first electrode through the side face of the device to the other electrode (for example, the third electrode described later) formed on the first conductivity type semiconductor layer or the substrate, the movement of the silver atom can be blocked due to the existence of the second electrode, thereby preventing short circuit of the device and lowering of the insulation resistance caused by re-precipitation of silver.

In addition, according to the present invention, an electric potential barrier at a contact portion between the first electrode and the second conductivity type semiconductor layer is preferably smaller than an electric potential barrier at a contact portion between the second electrode and the second conductivity type semiconductor layer. Thereby, when the semiconductor device is electrically energized, an electric current is more likely to flow from the first electrode to the second conductivity type semiconductor layer rather than from the second electrode. For example, in the case of the light emitting device, the emitted light caused by an injected carrier from the first electrode is more intensified so that the luminous efficiency for usage is improved. On the contrary, if the electric potential barrier at the contact portion of the second electrode and the second conductivity type semiconductor layer is smaller, the electric current is likely to flow to the second electrode for preventing the electro-migration so that the luminous efficiency is lowered.

Moreover, according to the present invention, an ohmic property at the contact portion between the first electrode and the second conductivity type semiconductor layer is preferably better than an ohmic property at the contact portion between the second electrode and the second conductivity type semiconductor layer. Thereby, when the semiconductor device is electrically energized, an electric current is more likely to flow from the first electrode to the second conductivity type semiconductor layer rather than from the second electrode. For example, in the case of the light emitting device, the emitted light caused by an injected carrier from the first electrode is more intensified so that the luminous efficiency in use is improved. On the contrary, if the electric potential barrier at the contact portion of the second electrode and the second conductivity type semiconductor layer is smaller, the electric current is likely to flow to the second electrode for preventing the electro-migration so that the luminous efficiency is lowered.

In addition, according to the present invention, the first electrode preferably contains at least one among rhodium (Rh), palladium (Pd), nickel (Ni), and platinum (Pt). Thereby, the first electrode becomes thermally stable, its light absorption becomes small, and the ohmic contact with the GaN system semiconductor may be easily obtained.

Additionally, according to the present invention, the second electrode is preferably set at an electric potential equal to or higher than that of the first electrode. Thereby, there is no difference in electric potential between the first electrode and the second electrode, or alternatively an electric potential gradient going down from the second electrode to the first electrode may occur. As a result, the movement of the silver atoms residing in the first electrode may be restrained so that the occurrence of the electro-migration can be prevented.

In addition, according to the present invention, the second electrode preferably partially contacts with the first electrode on the surface of the second conductivity type semiconductor layer. Since a portion of the second electrode is formed so as to contact with the first electrode, it is possible to easily maintain both the first electrode and the second electrode at the same electric potential to restrain the occurrence of the electro-migration. In one aspect where a portion of the second electrode contacts with the first electrode, the second electrode and the first electrode are sufficient to enable conduction between them. For example, the second electrode, with a width of a few nanometers, may be formed so as to be elongate in the form of bar toward and in contact with the first electrode. Alternatively, the first electrode may be formed so as to be elongate in the form of bar toward and in contact with the second electrode. Further, other conductive material different from the first electrode and the second electrode may be formed in contact with both of the first electrode and the second electrode. The smaller the area of such a conduction portion is, the larger the light extracting surface can be. Thus, assuming that a portion at which the second electrode and the first electrode are in conductive contact is defined as the conduction portion, the area of this conduction portion is preferably smaller. More preferably, the conduction portion is formed with a width shorter than the shortest distance between the first electrode and the second electrode over an area in which no electrode is formed.

In addition, the conduction portion between the second electrode and the first electrode may be formed so that the second electrode overlays the first electrode, or the first electrode overlays the second electrode.

Additionally, in another aspect where a portion of the second electrode contacts with the first electrode, the conduction portion as described above may not be formed intentionally, and by applying a voltage between the first electrode containing silver and the second electrode to generate the electro-migration of silver, short-circuit and conduction may be made between the first electrode and the second electrode, resulting in that both electrodes are at the same electric potential. Granted that the conduction portion due to the electro-migration is broken off later, the electro-migration may occur subsequently in another place so that the conduction may be maintained continuously, and practically the electric potential of the first electrode becomes the same as that of the second electrode.

In addition, according to the present invention, it is preferable that a pad electrode for leading out is formed so as to contact with both of the first and second electrodes. In the case that the pad electrode such as a bonding pad or the like is formed on a surface of the second conductivity type semiconductor layer, the bonding pad may be formed so as to contact with any one portion of the first electrode or the second electrode, that is, the bonding pad may be formed only on the first electrode or only on the second electrode. Alternatively it may be formed as being elongated from the first electrode or the second electrode to be bonded with a wire or the like at a position apart from the first and second electrodes. The pad electrode may be preferably disposed on the first and second electrodes so as to bridge across a portion of each of the first and second electrodes. Bridging across a portion of each of the first and second electrodes allows the first and second electrodes to be set at the same electric potential.

Incidentally, since the bonding pad is an electrode to be mounted with the wire or the like, a certain degree of film thickness thereof is required in order to cause no damage to the semiconductor device during mounting, so the bonding pad is formed thicker than the first and the second electrodes. Here, in case of the light emitting device where the light is extracted from the side of the second conductivity type semiconductor layer, since the light is not emitted outside from the bonding pad portion, the bonding pad is required to be formed as small as possible when the bonding pad bridges across the first and second electrodes.

In the semiconductor device according to the present invention, a film having an electrical insulation such as $SiO_2$, SiN or the like may be formed continuously over the exposed portions of the second and the first conductivity type semiconductor layers and the side face of the device having stacked semiconductor layers. Forming the film having the electrical insulation allows the device to be protected with high reliability. Particularly, the film having the electrical insulation is preferably disposed on a portion in which no electrode is formed, thereby restraining the occurrence of the electro-migration of silver in the first electrode.

Furthermore, with a view to protecting the device, it is preferable that the electrical insulation film such as $SiO_2$ and SiN or the like is formed on the first electrode containing silver and the second electrode. In this case, when oxide of silver is generated due to a rising temperature of the device, the light reflection characteristic of the first electrode tends to be lowered. Thus, the electric insulation film is preferably made of a material excluding oxygen, for example, SiN.

Additionally, in the case of forming a pad electrode such as a bonding pad or the like, disposing a film having an electrical insulation between the bonding pad and the second conductivity type semiconductor layer allows a step between the first and second electrodes and a no-electrode formed portion to become smaller. This is preferable because the bonding pad to be formed thereon has a flat face to be easily mounted.

In addition, according to the present invention, it is preferable that the surface of the second conductivity type semiconductor layer has an area in which no electrode is formed between an area in which the first electrode is formed and an area in which the second electrode is formed. This no-electrode formed portion is preferably disposed so that the shortest distance between the first electrode and the second electrode becomes 0.5 $\mu$m or more.

The first electrode is made of a material including at least silver. However, silver has the nature of to easily reflecting light of a wavelength of about 340 nm or longer. For example, in the case of the light emitting device having a peak light emission at 340 nm or longer, the light emitted under the first electrode is reflected so that the light from the side of the second conductivity type semiconductor layer is not efficiently emitted to the outside. Therefore, disposing the no-electrode formed portion between the first and second electrodes allows the light to be effectively emitted to the outside. When the no electrode formed area is disposed in this way, the emitted light is repeatedly reflected between the first electrode and one surface (when mounted on a stem, this means the mounted face) on which the electrode of the light emitting device is not formed, so finally most of the light can be emitted from the no electrode formed area. Further, by providing the no electrode formed area, there is no limitation in selection of the metal material to be used for the second electrode, so that, even if a material that easily absorbs the emitted light is used, a light emitting device having high efficiency for extracting the light can be obtained.

In addition, according to the present invention, it is preferable that the first electrode has an opening portion inside of the outline of the first electrode so the second conductivity type semiconductor layer is exposed at the opening portion. By providing such an opening portion, for example, in the case of the light emitting device having a peak of light emission at 340 nm or longer, the light emitted under the first electrode is reflected on the first electrode formed portion, while the light is emitted outside through the opening portion. Further, the emitted light is repeatedly reflected between the first electrode and one surface (when mounted on a stem, this means the mounted face) on which the electrode of the light emitting device is not formed, and finally most of the light can be emitted through the opening portion, resulting in high efficiency for extracting the light.

In addition, according to the present invention, it is preferable that the semiconductor device is the light emitting device, and in a light emitting area on the surface of the second conductivity type semiconductor layer, a light emission intensity at the periphery of the first electrode is stronger than that at the remaining light emitting area except for the periphery of the first electrode. Incidentally, the periphery of the first electrode corresponds to the outline modeling the first electrode, and in the case of forming the opening, the outline of this opening is also included in the periphery. The periphery of the first electrode including the outline of the opening can generate a strong emission of light. It is considered that this is because a high electric field is generated locally at the periphery of the first electrode so that the largest electric current flows at the periphery of the electrode. Therefore, when the open area ratio of the opening portion with respect to the first electrode is constant, the longer the distance of the periphery of the first electrode is made, and the more portions for emitting the strong light that result, the further $V_f$ preferably tends to be lowered. Specifically, in the case of providing a plurality of circle openings subsequently to the formation of the first electrode, the smaller the diameter of the circle is made and the greater the number of circles as the openings are formed, the lower $V_f$ comes to be.

In addition, according to the present invention, it is preferable that at the first electrode, $L/S \geq 0.024\ \mu m/\mu m^2$ is established, where Sa is a gross area of a plurality of opening portions at which the second conductivity type semiconductor layer is exposed, Sb is an area of a no-opening portion at which the second conductivity type semiconductor layer is not exposed, S is the sum of Sa and Sb, and is the sum of the inner peripheries of all the opening portions. Thus, in the light emitting area on the surface of the second conductivity type semiconductor layer, the efficiency for extacting the light is enhanced so that a semiconductor device having a low $V_f$ may be obtained.

In addition, according to the present invention, it is preferable that each opening portion has substantially the same form or substantially the same area. Thus, it becomes easy to form the opening portion, the light distribution within the face becomes even, and the efficiency for extracting the light is enhanced.

Figure 10:
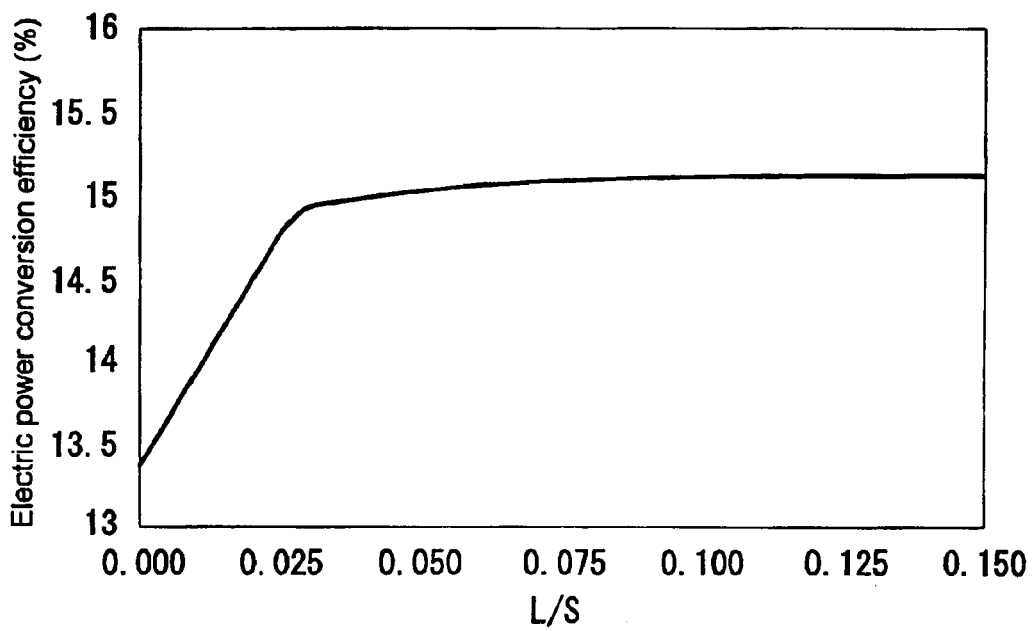
FIG. 10 is a graph showing electric power conversion efficiency when an inner periphery length of an opening 5 is changed while an open area ratio is the same.

FIG. 10 is a graph for showing electric power conversion efficiency when an inner periphery length of an opening 5 is changed while the open area ratio is the same, namely, the gross area of the openings 5 is the same. Since the gross area of the openings 5 is the same, the contact area between a first electrode 1 and a semiconductor layer 104 having the p-conductivity is the same, so that it may be considered that $V_f$ and the quantum efficiency are the same. However, when the inner periphery length is changed, the electric power conversion efficiency is changed as in the graph of FIG. 10.

From this graph, it can be found that, even if the open area ratio is the same, by changing the inner periphery length of the opening portion, it is possible to further obtain a higher output. Further, according to the present invention, within the range fulfilling $L/S \geq 0.024\ \mu m/\mu m^2$, the light emitting device of the higher output can be obtained. If L/S is smaller than $0.024\ \mu m/\mu m^2$, it is not preferable, because the effect of providing the openings 5 is lowered. Further, although the upper limit of L/S is not particularly defined, if L/S is larger than $1\ \mu m/\mu m^2$ in substance, the size of each of the openings 5 becomes too small and impractical.

As described above, the output efficiency from the side of the semiconductor layer 104 having the p-conductivity largely depends on the inner periphery length of the opening 5 rather on the gross area thereof, because the particularly strong emitted light is observed at a boundary between the electrode and the semiconductor layer 104. Therefore, by forming more boundaries, namely, making the inner periphery length longer, it is possible to emit the light effectively. In order to form more boundaries, by providing not only the opening, but also the most outer periphery of the first electrode 1 not in a linear line, but in an anfractuous continuous line along the end portion of the semiconductor layer 104, it is possible to form more boundaries between the first electrode 1 and the semiconductor-layer 104, thereby enhancing the output.

By forming plural openings as described above in the approximately same shapes, it becomes easy to effectively form a plurality of openings. Further, the distribution within the face is easily made uniform, so that equable light emission can be obtained. As a shape, various shapes such as a square, a circle, and a triangle or the like can be employed. The opening is preferably formed in a square, and by forming a plurality of openings so that they are dispersed evenly at a predetermined distance spaced from the adjoining opening, it becomes easy to obtain uniform light emission. In addition, by forming the area of each opening substantially the same, it is possible to select a preferable shape depending on the position of the opening.

A cross section of the peripheral portion of the first electrode, including the outline of the opening, is preferably formed in a mesa shape as that the end face of the electrode is inclined upward rather than a rectangular cross section with the end face of the electrode being vertical. The intensity of the light emission at the peripheral portion of the electrode thereby becomes higher, so that the efficiency of extracting the light is entirely improved.

Figure 11A:
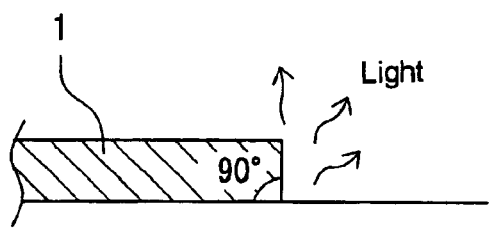
FIG. 11A is a partial cross sectional view showing a case in which an electrode end face angle θ is 90°.
Figure 11B:
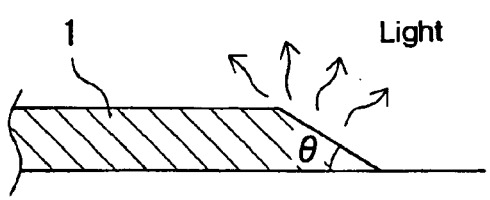
FIG. 11B is a partial cross sectional view showing a case in which the electrode end face angle θ is less than 90°.

FIG. 11A is a partial cross sectional view for showing a case in which the electrode end face angle θ is 90°, and FIG. 11B is a partial cross sectional view showing a case in which the electrode end face angle e is less than 90°. If the electrode end face is vertical against a surface of the semiconductor layer, the light emitted from the peripheral portion of the electrode is deflected laterally rather than upwardly from the device. On the other hand, if the electrode end face is inclined against the surface of the semiconductor layer, the light emitted from the peripheral portion of the electrode is more distributed in the upward direction of the device. As a result, the intensity of the light emission at the peripheral portion of the electrode becomes higher so that the efficiency of extracting the light is entirely enhanced.

The end face angle θ of the electrode with respect to the surface of the semiconductor layer is preferably in the range of 30°≦θ<90°. When the angle θ becomes less than 30°, the electric resistance at the slope portion of the electrode is higher, and the intensity of the light emission at the edge portion is lowered. Therefore, the angle θ is preferably 30° and above.

The semiconductor device according to the present invention brings about a noticeable effect in a nitride semiconductor containing gallium. The nitride semiconductor including gallium (GaN system semiconductor) means the semiconductor made of $Al_xIn_yGa_{1-x-y}N$ (0≦x, 0≦y, x+y<1), which also includes a nitride semiconductor containing gallium that constitutes a portion of the semiconductor device. In other words, even the nitride semiconductor layer other than $Al_xIn_yGa_{1-x-y}N$ (0≦x, 0≦y, x+y<1) which contains boron or phosphor is also included in this. Particularly, in the case that the GaN system semiconductor is not doped with impurities (i.e. undoped), the conductivity type represents the n-type. By doping with the impurities as a p-type such as Mg or the like, it comes to represent the p-type. However, the electric resistivity of the p-type GaN semiconductor is difficult to lower, that is, the electric resistivity is higher than the n-type GaN system semiconductor. Therefore, since the electric current flowing through the GaN system semiconductor is hard to expand in the p-type semiconductor layer, a p-electrode is formed on the whole surface of a p-side contact layer so as to allow the electric current to evenly flow on the entire p-type semiconductor layer. Accordingly, the structure of the present invention, wherein the first electrode including silver and the second electrode excluding silver are provided on the surface of the semiconductor layer, and various features are elaborated on each electrode, may represent a noticeable effect particularly in the GaN system semiconductor.

In this case, the second conductivity type semiconductor layer on which the first and second electrodes are formed is preferably a p-conductivity type of nitride semiconductor containing gallium (GaN system semiconductor), more preferably Mg-doped $Al_mGa_{1-m}N$ (0≦m<1), most preferably Mg-doped GaN. $Al_mGa_{1-m}N$ (0≦m<1) doped with Mg is formed with relatively better crystalline among GaN system semiconductors. A surface of $Al_mGa_{1-m}N$ (0≦m<1) doped with Mg becomes a flat and smooth face so that electrodes with a complicated structure, such as the first and second electrodes, and further the pad electrode according to the present invention, can be formed with high reliability. Specifically, GaN (in case of m=0) doped with Mg is easily formed with a lower electric resistivity among the GaN system semiconductors representing the p-type, thereby easily obtaining ohmic contact with electrodes.

In addition, according to the present invention, it is preferable that the first conductivity type semiconductor layer is exposed by partial etching of the second conductivity type semiconductor layer, and on the surface where the first conductivity type semiconductor layer is exposed, a third electrode is formed.

The semiconductor device according to the present invention has two principal faces. Assuming that a surface of the second conductivity type semiconductor layer is defined as a first principal face and another face on the side of a substrate is defined as a second principal face, the first and second electrodes may be formed on the first principal face and the third electrode may be formed on the second principal face. When using a substrate having electrical conductivity, such as an SiC substrate or the like, an electrode of a first conductivity type can be formed on the substrate. However, an electrode (hereinafter, occasionally referred to as the third electrode) to be formed on the surface of the first conductivity type semiconductor layer in the semiconductor device according to the present invention may be formed on the surface of the first conductivity type semiconductor layer where a portion of the second conductivity type semiconductor layer is etched and exposed. For example, for the nitride semiconductor containing gallium (GaN system semiconductor), the GaN system semiconductor can preferably grow on a substrate having electrical insulation, such as a sapphire substrate or the like. The semiconductor device in which the first conductivity type semiconductor layer and the second conductivity type semiconductor layer are layered sequentially on the substrate having the electrical insulation is hard to have an electrode on the side of the sapphire substrate. Therefore, the third electrode to be formed on the first conductivity type semiconductor layer is required to be formed by etching a portion of the surface of the second conductivity type semiconductor layer and exposing the first conductivity type semiconductor layer, because the counter electrode cannot be formed on the bottom surface. In such a semiconductor device where the counter electrode cannot be formed on the bottom surface, particularly, when the first electrode containing silver is used, silver easily causes the electro-migration from the first electrode toward the third electrode. In this case, the structure of the present invention is employed so that the effect of the present invention is noticeably exerted. Here, the third electrode may be a material capable of obtaining good ohmic contact with the first conductivity type semiconductor layer.

In the semiconductor according to the present invention, the first conductivity type semiconductor layer is preferably an n-type semiconductor layer, and the second conductivity type semiconductor layer is preferably a p-type semiconductor layer. As described above, in the case in which the GaN system semiconductor is not doped with impurities (i.e. undoped), the conductivity type represents the n-type, and by doping with the impurities as a p-type such as Mg or the like, it comes to represent the p-type. However, by only doping with Mg to grow the GaN semiconductor, a GaN system semiconductor representing a good p-type conductivity cannot be obtained. Therefore, an annealing process, e.g., at 600° C., is required after stacking an n-type semiconductor layer and a semiconductor layer doped with Mg on the substrate, so that Mg is electrically activated to obtain a p-type GaN system semiconductor with low electric resistivity. It is considered at one standpoint that hydrogen residing in the p-type semiconductor layer may be removed by annealing to make the electric resistivity lowered. In such a case of lowering the electric resistivity by annealing, hydrogen is effectively removed by locating a layer in which electric resistivity is lowered at the furthest side from the substrate. Therefore, the most preferable configuration is such that the first conductivity type semiconductor layer is n-type and the second conductivity type semiconductor layer is p-type.

The present invention is described with respect to the semiconductor light emitting device in which the GaN system semiconductors are layered. However, it is not limited to the light emitting device and the GaN system semiconductor, as long as the semiconductor device satisfies the conditions described above.

In the present invention, it is defined that the first conductivity type semiconductor layer may have one or more layers of the first conductivity type semiconductor and the second conductivity type semiconductor layer may have one or more layers of the second conductivity type semiconductor.

Specific constitutions according to the present invention will be described below.

[Embodiment 1]

Figure 2:
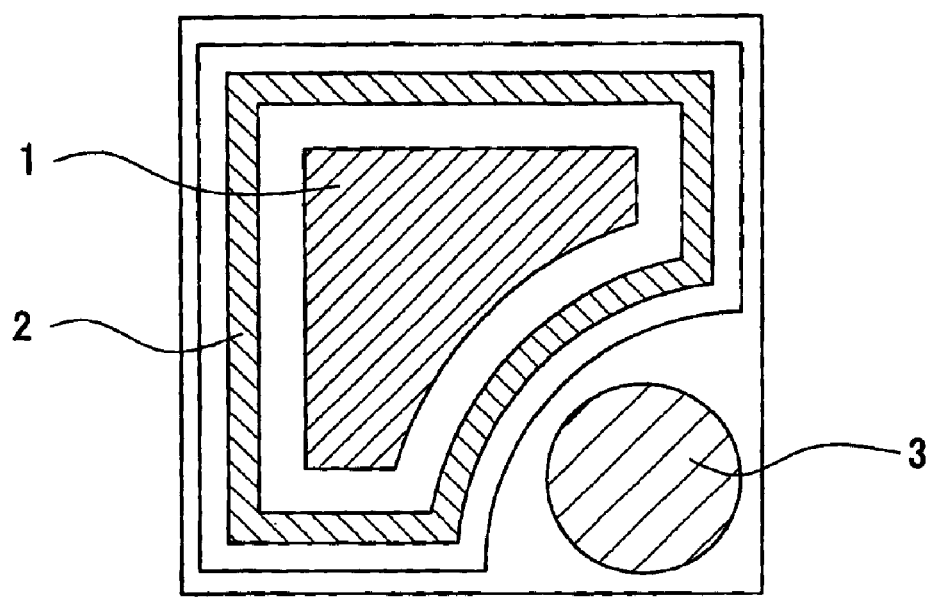
FIG. 2 is a top plan view of the semiconductor device according to the first embodiment of the present invention.

The present embodiment is structured in such a manner that on a substrate 101, such as a sapphire layered substrate, are an n-conductivity type nitride semiconductor layer 102 (an n-conductivity type semiconductor layer), an active layer 103, and a p-conductivity type nitride semiconductor layer 104 (a p-conductivity type semiconductor layer). As shown in FIG. 1 (a perspective view) and FIG. 2 (a top plan view), at a predetermined area in this semiconductor device, the p-conductivity type nitride semiconductor layer 104, the active layer 103, and a portion of the n-conductivity type nitride semiconductor layer 102 are removed and a surface on which an electrode is formed on the n-conductivity type nitride semiconductor layer 102 is exposed.

Further, resist films are applied corresponding to the outline of the surface on the p-conductivity type nitride semiconductor layer 104 and onto the whole exposed surface of the n-conductivity type nitride semiconductor layer 102, followed by spattering a first electrode 1 containing silver so as to be formed on the whole area, and followed by removing the resist films so that the first electrode 1 is formed. Next, a resist film is applied along the outside of the outline of the first electrode 1 so that a second electrode 2 is formed along the inside of the outline of the surface of the p-conductivity type nitride semiconductor layer 104, the second electrode 2 excluding silver is formed on the whole area, and the resist film is removed to form the second electrode 2.

Next, by applying a resist film and spattering process, an n-side electrode 3 (an electrode at the side of the n-conductivity type) configured of W/Al/W/Pt/Au is formed on the exposed surface of the n-conductivity type nitride semiconductor layer 102.

In this light emitting device, a positive electrode was connected to the first electrode 1 and the second electrode 2, a negative electrode was connected to the n-side electrode 3, and a voltage was applied to emit light. Then, by comparison to a light emitting device shown in a comparative example 1 described later, 150% improvement in the efficiency of extracting light was observed.

COMPARATIVE EXAMPLE 1

Figure 12:
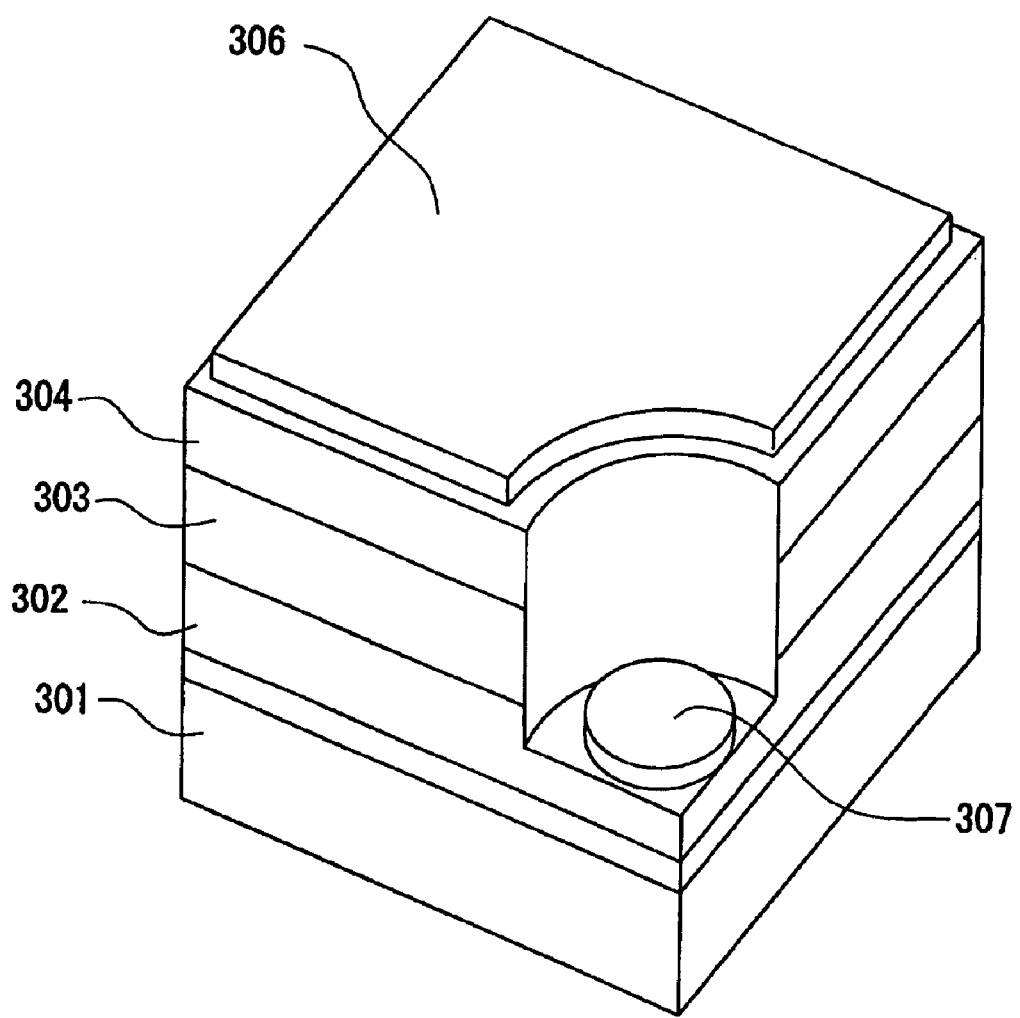
FIG. 12 is a perspective view of a conventional semiconductor device (comparative example).
Figure 13:
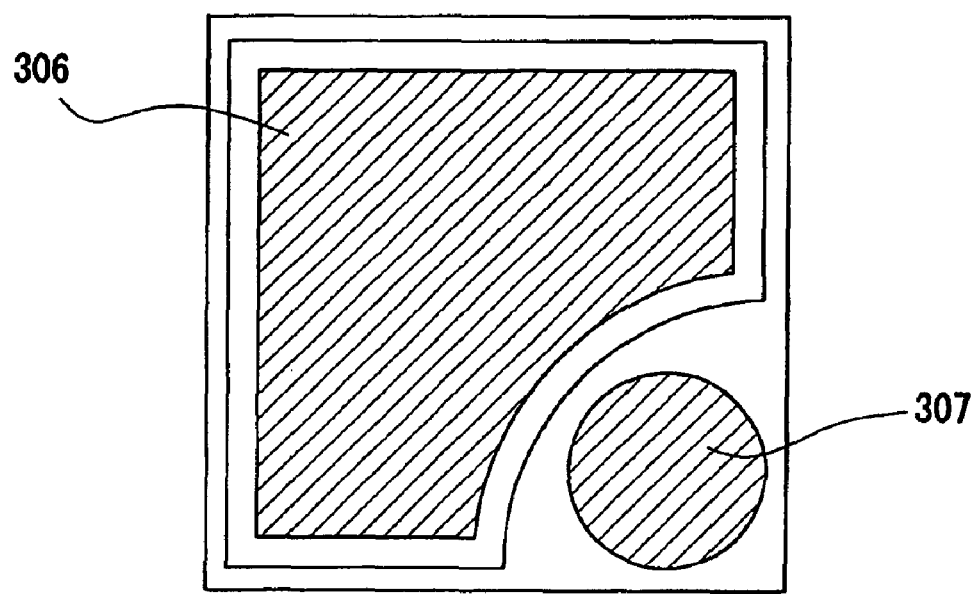
FIG. 13 is a top plan view of the conventional semiconductor device (comparative example).

The present comparative example is structured in such a manner that on a sapphire substrate 301 are layered an n-conductivity type nitride semiconductor layer 302 (an n-conductivity type semiconductor layer), an active layer 303, and a p-conductivity type nitride semiconductor layer 304 (a p-conductivity type semiconductor layer). As shown in FIG. 12, at a predetermined area in this semiconductor device, the p-conductivity type nitride semiconductor layer 304, the active layer 303, and a portion of the n-conductivity type nitride semiconductor layer 302 are removed, and a surface on which an electrode is formed on the n-conductivity type nitride semiconductor layer 302 is exposed.

Next, by applying a resist film and a spattering process, a p-side electrode 306 (an electrode at the side of the second conductivity type) configured of Ni/Au is formed on approximately the whole area of the surface of the p-conductivity type nitride semiconductor layer 304 in this nitride semiconductor device and an n-side electrode 307 (an electrode at the side of the n-conductivity type) configured of Ti/Al is formed on the exposed surface of the n-conductivity type nitride semiconductor layer 302.

In this light emitting device, a positive electrode was connected to the p-side electrode 306, a negative electrode was connected to the n-side electrode 307, and voltage was applied to emit light. The efficiency for extracting the light in this case was defined as a reference value of 100%.

[Embodiment 2]

Figure 3:
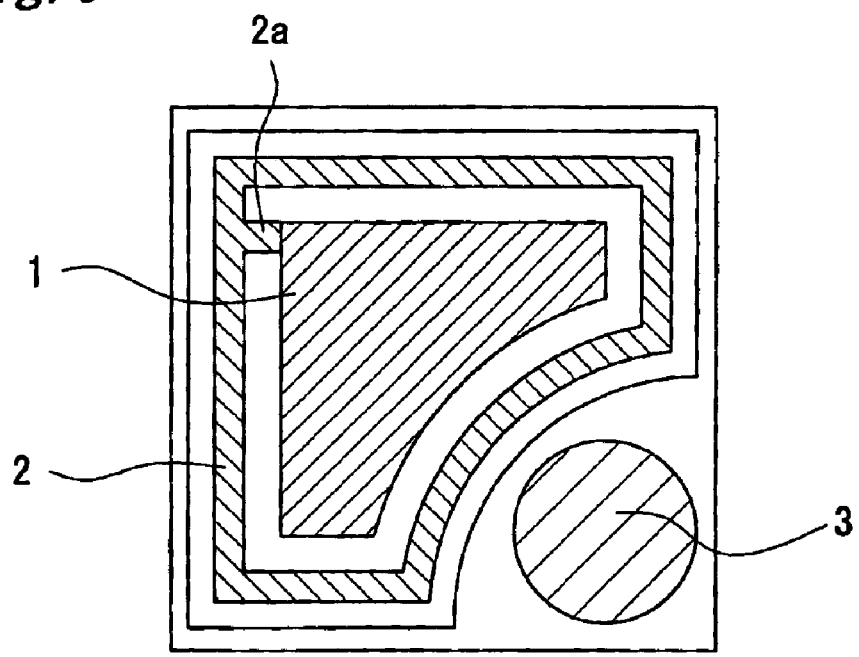
FIG. 3 is a top plan view of a semiconductor device according to another embodiment of the present invention.

The present embodiment is structured in such a manner that on the substrate 101, such as a sapphire layered substrate, are the n-conductivity type nitride semiconductor layer 102 (an n-conductivity type semiconductor layer), the active layer 103, and the p-conductivity type nitride semiconductor layer 104 (a p-conductivity type semiconductor layer). As shown in FIG. 3, at a predetermined area in this semiconductor device, the p-conductivity type nitride semiconductor layer 104, the active layer 103, and a portion of the n-conductivity type nitride semiconductor layer 102 are removed and a surface, on which an electrode 3 is to be formed on the n-conductivity type nitride semiconductor layer 102, is exposed.

Next, resist films are applied onto both the surface other than a second electrode formed portion on the p-conductivity type nitride semiconductor layer 104 and onto the whole surface of the n-conductivity type nitride semiconductor layer 102, followed by spattering so that a second electrode 2 can be formed, and followed by removing the resist films so that the second electrode 2 is formed. In this case, the second electrode 2 is shaped correspondingly to the outline of the surface of the p-conductivity type nitride semiconductor layer 104. Further, a portion thereof, with a width of 0.3 $\mu$m and a length of 0.8 $\mu$m which is extended toward the inside of the surface of the p-conductivity type nitride semiconductor layer, is formed to provide a conduction portion 2a to be in contact with the first electrode 1.

Next, the first electrode 1 is disposed on the surface of the p-conductivity type nitride semiconductor layer 104 within the second electrode 2. In this case, at first, resist films are applied onto both the surface other than the second electrode formed portion on the p-conductivity type nitride semiconductor layer 104 and onto the whole surface of the n-conductivity type nitride semiconductor layer 102, followed by spattering the first electrode 1 made of silver, and followed by removing the resist film so that the first electrode 1 is formed. In this case, the first electrode 1 is formed so that a portion thereof (for example, width of 0.3 $\mu$m, length of 0.3 $\mu$m) may overlap partially a front end of the conduction portion 2a of the second electrode 2 (width of 0.3 $\mu$m, length of 0.8 $\mu$m).

Next, by applying a resist film and spattering process the n-side electrode 3 (an electrode at the side of the n-conductivity type) configured of W/Al/W/Pt/Au is formed on the exposed surface of the n-conductivity type nitride semiconductor layer 102.

In this light emitting device, a positive electrode was connected to the first electrode 1 and the second electrode 2, a negative electrode was connected to the n-side electrode 3, and a voltage was applied to emit light. The efficiency of extracting the light was approximately the same as with Embodiment 1 and irregularities in light emission were hardly observed.

[Embodiment 3]

Figure 4:
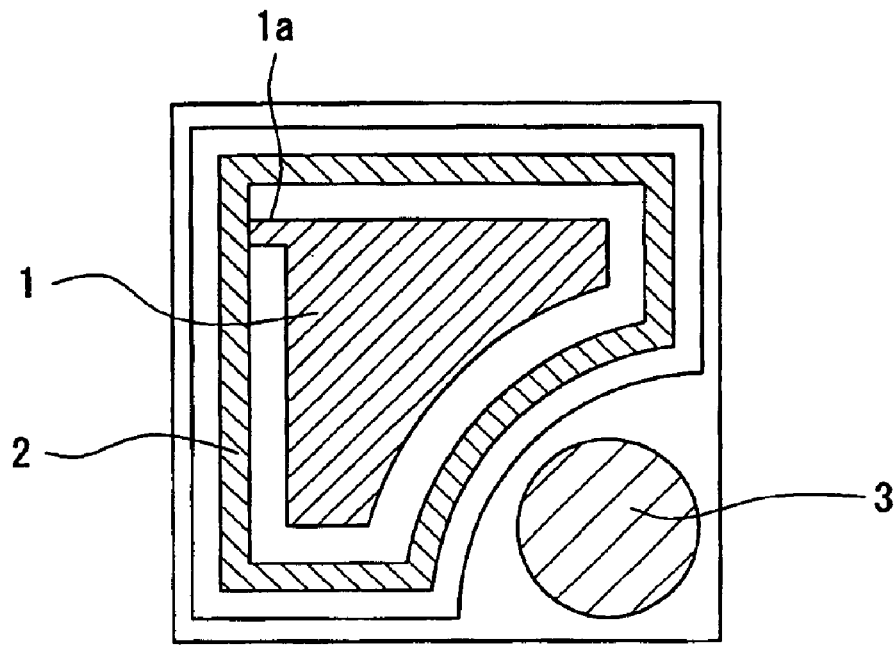
FIG. 4 is a top plan view of a semiconductor device according to yet another embodiment of the present invention.

In the light emitting device according to Embodiment 3, as shown in FIG. 4, a portion of the first electrode 1, with a width of 0.3 μm and a length of 0.8 μm which is extended toward the outside of the surface of the p-conductivity type nitride semiconductor layer, is formed between the first electrode 1 and the second electrode 2 to provide a conduction portion 1a in contact with the second electrode 2. In this case, the conduction portion 1a of the first electrode 1 is formed so that a portion thereof (for example, width of 0.3 μm, length of 0.3 μm) may overlap the upper part of the second electrode 2. In this light emitting device, a positive electrode was connected to the first electrode 1 and the second electrode 2, a negative electrode was connected to the n-side electrode 3, and a voltage was applied to emit the light. The efficiency of extracting light was approximately the same as Embodiment 1 and irregularities in light emission were hardly observed.

[Embodiment 4]

Figure 5:
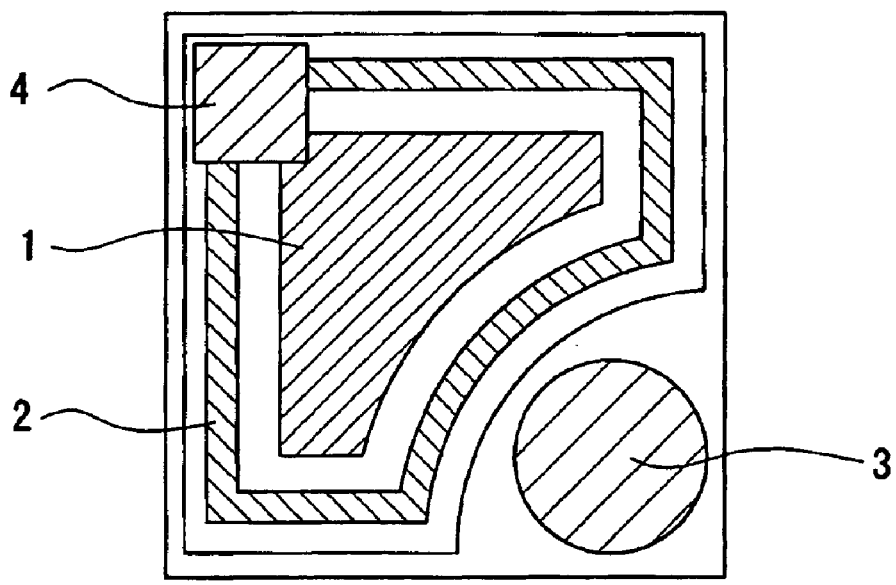
FIG. 5 is a top plan view of a semiconductor device according to still another embodiment of the present invention.

In the light emitting device according to Embodiment 4, as shown in FIG. 5, in view of the layering direction of the light emitting device, a p-side pad electrode 4 made of gold is formed at a corner opposite to the n-side electrode 3 on a common diagonal line. This p-side pad electrode 4 bridges the first electrode 1 and a portion of the second electrode 2. In other words, the p-side pad electrode 4 partially contacts with the p-conductivity type nitride semiconductor layer, the first electrode 1 and the second electrode 2. In this light emitting device, a positive electrode was connected to the first electrode 1 and the second electrode 2, a negative electrode was connected to the n-side electrode 3, and a voltage was applied to emit light. A light emitting device having an efficiency of extracting light lower than that of Embodiment 1, but higher than that of Comparative example 1, was obtained.

[Embodiment 5]

Figure 6:
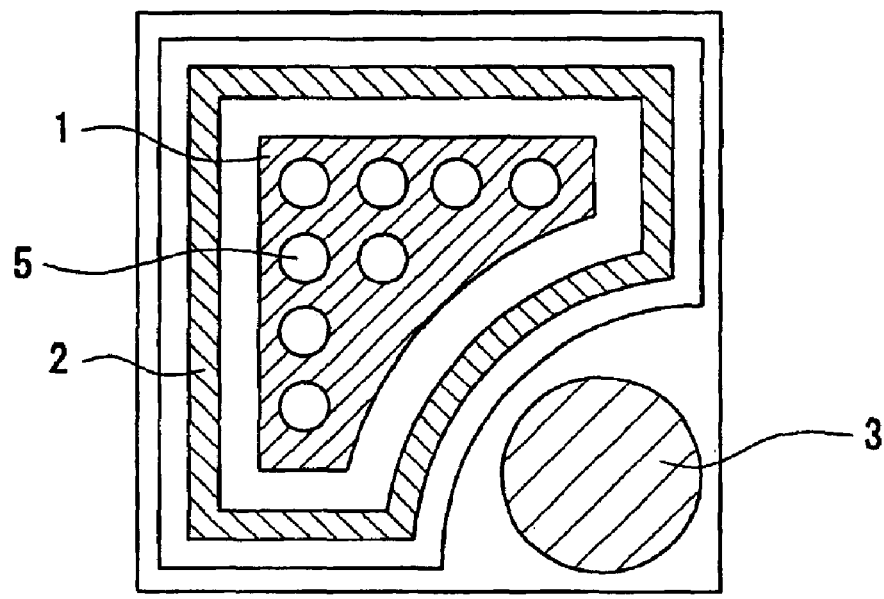
FIG. 6 is a top plan view of a semiconductor device according to still another embodiment of the present invention.

In the light emitting device according to Embodiment 5, as shown in FIG. 6, a plurality of circle openings 5 with a diameter of 20 μm is provided within the first electrode 1 containing silver by etching so as to expose the semiconductor layer having the p-type conductivity, with an open area ratio of 50% over the opening area with respect to the first electrode 1. Then voltage was applied to emit light. A light emitting device having approximately the same efficiency of extracting light as that of Embodiment 1 and having a smaller $V_f$ as compared to Embodiment 1 was obtained.

[Embodiment 6]

Figure 7:
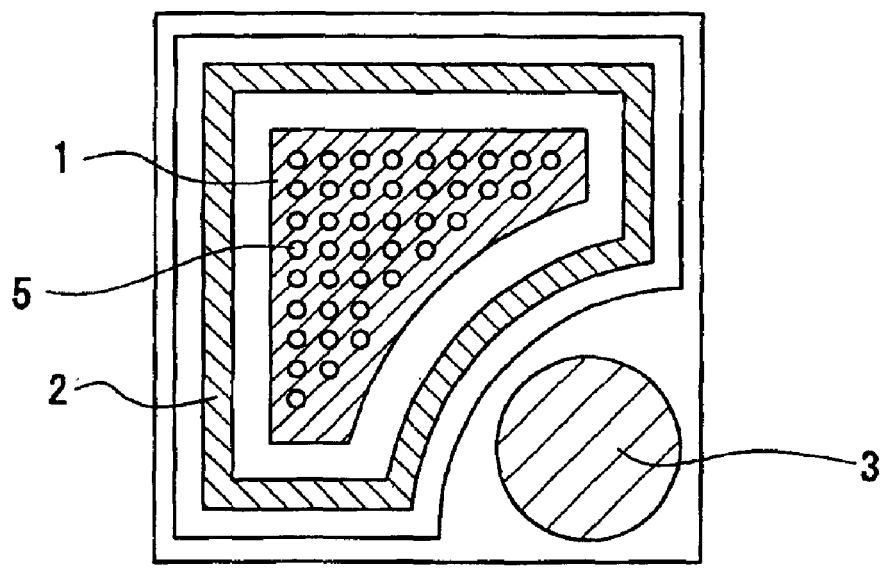
FIG. 7 is a top plan view of a semiconductor device according to still another embodiment of the present invention.

In the light emitting device according to Embodiment 6, as shown in FIG. 7, a plurality of circle openings 5 with a diameter of 10 μm is provided within the first electrode 1 containing silver by etching so as to expose the semiconductor layer having the p-type conductivity, with an open area ratio of 50% over the opening area with respect to the first electrode 1. A voltage was applied to emit light. A light emitting device having approximately the same efficiency of extracting light as that of Embodiment 1 and having a $V_f$ smaller than that of Embodiment 5 was obtained. Thus, in the case of providing the openings 5, an effect of lowering the $V_f$ caused by making the opening area smaller and disposing a plurality of the openings 5 was observed.

[Embodiment 7]

Figure 8A:
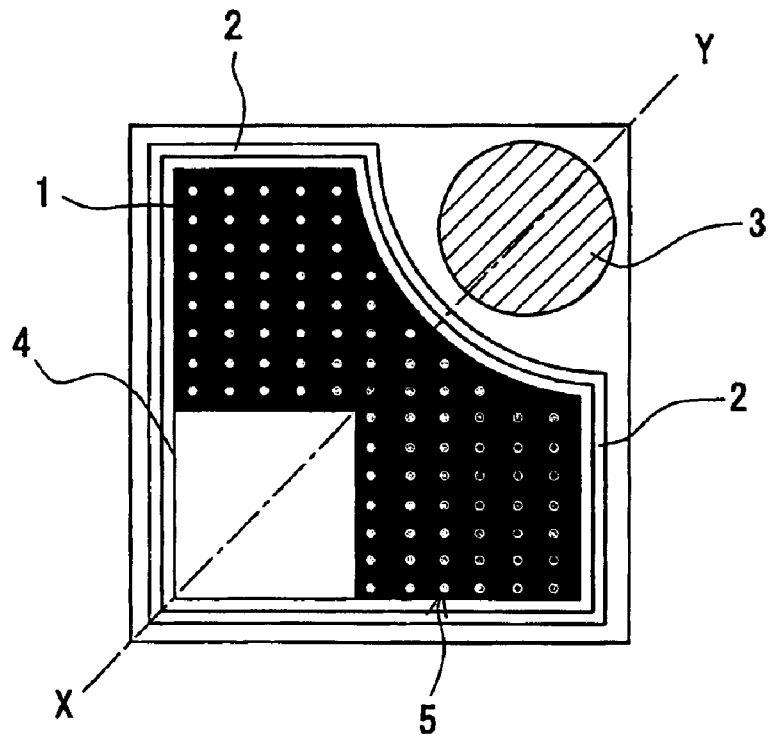
FIG. 8A is a plan view showing still another embodiment of the present invention.
Figure 8B:
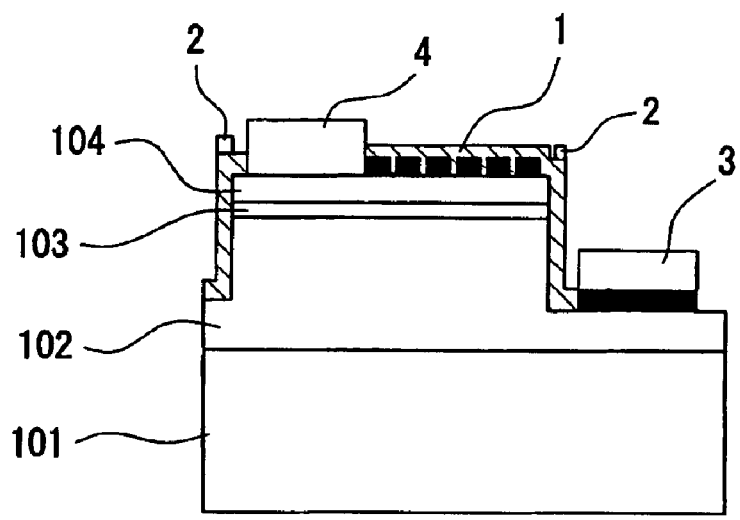
FIG. 8B is a cross sectional view thereof.

In the light emitting device according to Embodiment 7, as shown in FIGS. 8A to 8B, on the semiconductor layer 104 having the p-type conductivity, formed are the first electrode 1 including silver and the second electrode 2 excluding silver, so that the second electrode 2 surrounds the outside of the first electrode 1. The first electrode 1 is covered with an electric insulation protection film such as $SiO_2$ or SiN.

A p-side pad electrode 4 made of gold is formed, in view of the layering direction of the light emitting device, at a corner opposite to the n-side electrode 3 on the common diagonal line. Within the first electrode 1, 150 openings 5 are formed across approximately the whole area, each opening 5 being shaped to be approximately rectangular with one side of 5 μm.

In the light emitting device as described above, a sum L of the inner peripheries of the exposed openings 5 is 3,000 μm, an exposed area S surrounded by the most outer periphery of the first electrode 1 is 46,000 μm$^2$, and the ratio L/S is 0.065. In addition, the open area ratio, which is a ratio between the gross area of the exposed openings 5 and the exposed area S is 6.25%. An electric power conversion efficiency was about 16.9% with a $V_f$ of 3.4 V and an emission output of 11.5 mW at a current value of 20 mA. In this manner, the emission output can be increased by forming a plurality of the openings 5 on the first electrode 1.

[Embodiment 8]

In a light emitting device according to Embodiment 8, 600 openings 5 are formed across approximately the whole area within the first electrode 1, each opening 5 being shaped to be approximately rectangular with one side of 2.5 μm.

In the light emitting device as described above, the sum L of the inner peripheries of the exposed openings 5 is 6,000 μm, the exposed area S surrounded by the most outer periphery of the first electrode 1 is 46,000 μm$^2$, and the ratio L/S is 0.13. In addition, the open area ratio, which is a ratio between the gross area of the exposed openings 5 and the exposed area S, is 6.25%. An electric power conversion efficiency was about 17.4% with a $V_f$ of 3.4 V and an emission output of 12 mW at a current value of 20 mA. In this manner, the emission output can be increased by forming a plurality of the openings 5 on the first electrode 1.

[Embodiment 9]

Figure 9A:
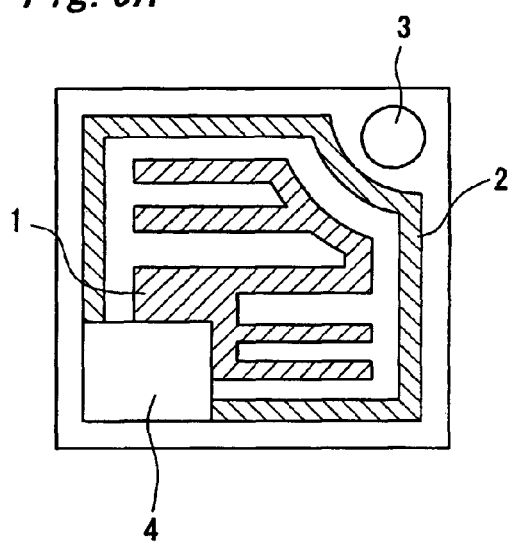
FIG. 9A and FIG. 9B are plan views showing other embodiments.
Figure 9B:
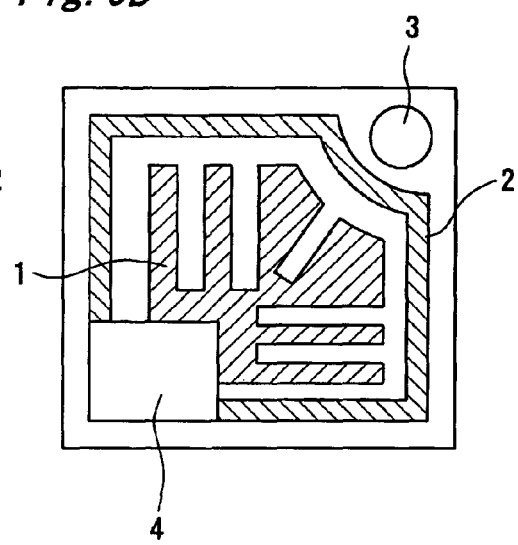

In the light emitting device according to Embodiment 9, as shown in FIGS. 9A to 9B, on the semiconductor layer 104 having the p-type conductivity, formed are the first electrode 1 including silver and the second electrode 2 excluding silver, so that the second electrode 2 surrounds the outside of the first electrode 1.

A p-side pad electrode 4 made of gold is formed, in view of the layering direction of the light emitting device, at a corner opposite to the n-side electrode 3 on the common diagonal line. The first electrode 1, as shown in FIG. 9A or FIG. 9B, is formed in a stripe structure. By adopting such a stripe electrode structure, the electric current to be supplied from the p-side pad electrode 4 to the semiconductor layer 104 can be made uniform within the face, and the light emission efficiency is improved.

A stripe gap of the first electrode 1 is formed as an opening at which the semiconductor layer 104 is exposed, so that the electrode edge length is increased remarkably, resulting in improved efficiency for extracting the light. In this case, it is preferable that a ratio of $L/S \geq 0.024$ μm/μm$^2$ is established. A gross area of a plurality of opening portions at which the semiconductor layer 104 is exposed is Sa, an area of no-opening electrode portion at which the semiconductor layer 104 is not exposed is Sb, the sum of Sa and Sb is S, and the sum of the inner peripheries of all the opening portions is L.

In the light emitting device as described above, an electric power conversion efficiency was about 14.3% with a $V_f$ of 3.5 V and an emission output of 10 mW at a current value of 20 mA.

As described above, according to the present invention, a semiconductor device has at least a first conductivity type semiconductor layer and a second conductivity type semiconductor layer, the second conductivity type being different from the first conductivity type, which are sequentially layered on a substrate. Electrodes are formed on surfaces of both the first conductivity type semiconductor layer and the second conductivity type semiconductor layer. A first electrode including at least silver and a second electrode excluding silver are formed on the surface of the second conductivity type semiconductor layer, with the second electrode surrounding the whole periphery of the first electrode. According to such a structure, it is possible to obtain a device having a good efficiency for extracting light and a high reliability without short circuits.

In addition, since the first electrode has an opening at which the second conductivity type semiconductor layer is exposed, inside of the outline of the first electrode, it is possible to obtain a device having a lowered $V_f$.

What is claimed is:

1. A semiconductor device comprising:
   a substrate;
   a first conductivity type semiconductor layer formed on said substrate;
   a second conductivity type semiconductor layer formed on said first conductivity type semiconductor layer, the second conductivity type being different from the first conductivity type; and
   a first electrode including at least silver and a second electrode excluding silver formed on a surface of said second conductivity type semiconductor layer, said second electrode surrounding a periphery of said first electrode.

2. The semiconductor device of claim 1, wherein said first electrode comprises a layer composed of silver, silver-nickel alloy, silver-palladium alloy, silver-rhodium alloy or silver-platinum alloy.

3. The semiconductor device of claim 1, wherein an electric potential barrier at a contact portion between said first electrode and said second conductivity type semiconductor layer is smaller than an electric potential barrier at a contact portion between said second electrode and said second conductivity type semiconductor layer.

4. The semiconductor device of claim 1, wherein an ohmic property at a contact portion between said first electrode and said second conductivity type semiconductor layer is better than an ohmic property at a contact portion between said second electrode and said second conductivity type semiconductor layer.

5. The semiconductor device of claim 1, wherein said first electrode contains at least one among rhodium, palladium, nickel and platinum.

6. The semiconductor device of claim 1, said second electrode is set at an electric potential equal to or higher than that of said first electrode.

7. The semiconductor device of claim 1, wherein said second electrode partially contacts with said first electrode on a surface of said second conductivity type semiconductor layer.

8. The semiconductor device of claim 1, wherein a pad electrode is formed so as to contact with both of said first electrode and said second electrode.

9. The semiconductor device of claim 1, wherein the surface of said second conductivity type semiconductor layer has an area in which no electrode is formed between an area in which said first electrode is formed and an area in which said second electrode is formed.

10. The semiconductor device of claim 9, wherein said area in which no electrode is formed is provided such that the shortest distance between said first electrode and said second electrode is not less than 0.5μm.

11. The semiconductor layer of claim 9, wherein an electrical insulation film is disposed on said area in which no electrode is formed.

12. The semiconductor device of claim 1, wherein said first electrode has an opening portion inside of an outline of said first electrode, said second conductivity type semiconductor layer being exposed at said opening portion.

13. The semiconductor device of claim 12, wherein:
   said opening portion comprises a plurality of opening portions; and
   at said first electrode, L/S≧0.024 $\mu m/\mu m^2$, Sa is a gross area of said plurality of opening portions at which said second conductivity type semiconductor layer is exposed, Sb is an area of a no-opening portion at which said second conductivity type semiconductor layer is not exposed, S is the sum of Sa and Sb, and L is the sum of the inner peripheries of all of said plurality of opening portions.

14. The semiconductor device of claim 12, wherein:
   said opening portion comprises a plurality of opening portions; and
   each of said opening portions has substantially the same form or substantially the same area.

15. The semiconductor device of claim 1, wherein:
   said semiconductor device is a light emitting device; and
   a light emitting area on the surface of said second conductivity type semiconductor layer has a light emission intensity at the periphery of said first electrode that is stronger than that at a remaining part of said light emitting area other than the periphery of said first electrode.

16. The semiconductor device of claim 1, wherein each said semiconductor layer is formed of nitride semiconductor containing at least gallium.

17. The semiconductor device of claim 1, wherein:
   said first conductivity type semiconductor layer is exposed by partial etching of said second conductivity type semiconductor layer to form an exposed surface on said first conductivity type semiconductor layer; and
   a third electrode is formed on said exposed surface on said first conductivity type semiconductor layer.

18. The semiconductor device of claim 1, wherein said first conductivity type semiconductor layer is an n-type semiconductor layer and said second conductivity type semiconductor layer is a p-type semiconductor layer.

19. The semiconductor layer of claim 1, wherein an electrical insulation film is formed on said fist electrode and said second electrode.

20. A semiconductor device comprising:
   a substrate;
   a first conductivity type semiconductor layer formed on said substrate;
   a second conductivity type semiconductor layer formed on said first conductivity type semiconductor layer, the second conductivity type being different from the first conductivity type; and
   a first electrode including at least silver and a second electrode excluding silver formed on a surface of said second conductivity type semiconductor layer.

* * * * *